United States Patent [19]

Fujiwara et al.

[11] Patent Number: 4,982,138
[45] Date of Patent: Jan. 1, 1991

[54] SEMICONDUCTOR WAFER TREATING DEVICE UTILIZING A PLASMA

[75] Inventors: Nobuo Fujiwara; Kenji Kawai; Moriaki Akazawa; Teruo Shibano; Tomoaki Ishida; Kyusaku Nishioka, all of Itami, Japan

[73] Assignee: Mitsubishi Denki Kabushiki Kaisha, Japan

[21] Appl. No.: 277,640

[22] Filed: Nov. 29, 1988

[30] Foreign Application Priority Data

Jul. 13, 1988 [JP] Japan .................. 63-172643

[51] Int. Cl.$^5$ ............................... H05H 1/46
[52] U.S. Cl. .................. 315/111.41; 315/111.21; 250/492.2; 204/298.31; 204/298.37; 204/298.38
[58] Field of Search ............ 315/111.21, 111.41; 250/492.2; 204/298.31, 298.38, 298.37

[56] References Cited

U.S. PATENT DOCUMENTS

| | | | |
|---|---|---|---|
| 4,125,431 | 11/1978 | Fowler | 376/140 |
| 4,252,608 | 2/1981 | Baldwin et al. | 376/140 |
| 4,330,384 | 5/1982 | Okudaira et al. | 204/298 MW X |
| 4,430,138 | 2/1984 | Suzuki et al. | 204/298 MW X |
| 4,543,465 | 9/1985 | Sakudo et al. | 315/111.41 X |
| 4,609,428 | 9/1986 | Fujimura | 204/298 MW X |
| 4,713,585 | 12/1987 | Ohno et al. | 315/111.21 X |
| 4,806,829 | 2/1989 | Nakao | 315/111.41 X |
| 4,857,809 | 8/1989 | Torii et al. | 315/111.41 X |
| 4,877,509 | 10/1989 | Ogawa et al. | 204/298 MW |
| 4,891,118 | 1/1990 | Ooiwa et al. | 204/298 MW |

OTHER PUBLICATIONS

Matsuoka et al, "Low-energy ion extraction with small dispersion from an electron cyclotron resonance microwave plasma stream", appl. Phys. Lett. 50 (26), Jun. 29, 1987.
De Dionigi et al, "Large Diameter rf Plasma for Pre--Ionization in Confinement Device", Applied Physics Letters, vol. 19, No. 1, Jul. 1971.

Primary Examiner—Eugene R. LaRoche
Assistant Examiner—Do Hyun Yoo
Attorney, Agent, or Firm—Leydig, Voit & Mayer

[57] ABSTRACT

A wafer treating device utilizing a plasma generated by a gas discharge caused by electron cyclotron resonance (ECR) includes a wafer treating chamber and a plasma generating chamber, a microwave supply for supplying microwave energy to the plasma generating chamber, and an electromagnetic coil which surrounds the plasma generating chamber to produce a minimum B-field therein. A plasma generated in the plasma generating chamber by electron cyclotron resonance is confined stably therein by the minimum B-field produced by the coil. Thus, the density and stability of the plasma in the plasma generating chamber are enhanced. The plasma in the plasma generating chamber is conveyed to a wafer in the wafer treating chamber along the diverging lines of a magnetic force. Examples of the minimum B-field producing coil include Ioffe bars, a baseball coil and an Yin-yang coil.

5 Claims, 2 Drawing Sheets

SEMICONDUCTOR WAFER TREATING DEVICE UTILIZING A PLASMA

BACKGROUND OF THE INVENTION

1. Field of the Invention

The present invention relates to devices for treating semiconductor wafers utilizing a plasma generated by a gas discharge.

2. Description of the Prior Art

In the production of semiconductor devices such as transistors and integrated circuits, semiconductor substrates, or wafers, are subjected to treatments such as thin film formation etching, oxidation, and doping. Some of such wafer treating devices utilize a plasma generated by a gas discharge. Recently, wafer treating devices utilizing a plasma generated by a gas discharge driven by electron cyclotron resonance (ECR) have been developed. These devices have a number of advantages over conventional chemical vapor deposition devices, including low operating temperatures and high treatment quality.

U.S. Pat. Application Ser. No. 357310 teaches a fundamental structure of such semiconductor wafer treating devices utilizing a plasma generated by electron cyclotron resonance. As shown in FIG. 3 of the drawings, such a device generally comprises a wafer treating chamber 1 accommodating a holder 8 holding a wafer 9, and a plasma generating chamber 2 disposed adjacent to and in direct communication with the wafer treating chamber 1. Microwave energy generated by a microwave source (not shown) is introduced into the plasma generating chamber 2 through a waveguide 3 and a quartz plate 4. Further, a solenoidal electromagnetic coil 5a surrounds the plasma generating chamber 2 to generate a magnetic field in the plasma generating chamber 2 and the wafer treating chamber 1. A gas introducing port 6 and a gas exhausting port 7 are formed in a wall of the plasma generating chamber 2 and in a wall of the wafer treating chamber 1, respectively.

The operation of the device of FIG. 3 is as follows. After the gas remaining in the chambers 1 and 2 is thoroughly exhausted from the port 7, a reactive gas is introduced into the chambers 1 and 2 through the port 6; at the same time, a part of the gas is exhausted from the port 7 to keep the pressure thereof at a predetermined level. Next, a microwave energy having a frequency of 2.45 GHz generated by the microwave source (not shown) is supplied to the plasma generating chamber 2 through the waveguide 3 and the quartz plate 4. Simultaneously, the coil 5a is energized to produce a magnetic field in the plasma generating chamber 2 and the wafer treating chamber 1; the flux density of the magnetic field in the plasma generating chamber 2 is regulated to 875 G to produce electron cyclotron resonance therein in cooperation with the microwaves; the magnetic field produced by the coil 5a in the wafer treating chamber 1 diverges from the plasma generating chamber 2 to the holder 8.

Thus, the electrons in the plasma generating chamber 2 are accelerated in helical paths in electron cyclotron resonance in the chamber 2, absorbing the energy from the microwave; the collisions of these fast moving electrons generate a dense gas plasma in the plasma generating chamber 2. The plasma thus generated is transported to the wafer 9 along the diverging lines of the magnetic field produced by the solenoidal coil 5a. Thus, the treatment of the wafer 9, e.g. thin film formation or etching, is effected on the surface thereof. As is well known, the kind of the gas utilized in the treatment or the pressure thereof, the power of the microwave source, etc., are chosen according to the type of the treatment which is effected on the wafer.

The conventional ECR plasma wafer treating devices, however, have disadvantages as described below. Since the conventional ECR plasma wafer treating devices utilize a solenoidal coil to produce a magnetic field therein, the magnetic field thus produced in the plasma generating chamber 2 is the strongest along the central axis thereof. Electrons in the plasma generating chamber 2 are thereby forced to move radially from the central axis toward the outer peripheral portions thereof. As a result, the confinement of the electrons therein is insufficient, and the density of plasma generation therein cannot be made as high as desired. Consequently, the speed of the reaction of the wafer treatment is low. Further, due to the insufficient confinement of the electrons, the plasma generated in the plasma generating chamber 2 is unstable so that the wafer treating process suffers a number of restrictions such as on the kind of the gas utilized in the generation of the plasma or the pressure thereof and the level of the output power of the microwave utilized to produce electron cyclotron resonance.

SUMMARY OF THE INVENTION

Accordingly, an object of the present invention is to provide a semiconductor wafer treating device utilizing a plasma generated by a gas discharge in which the density of plasma generation is raised to enhance the speed of a wafer treatment.

A further object of the present invention is to provide such a wafer treating device in which the stability of a plasma produced is improved and in which the generation of a plasma can be controlled easily so that the device is free from restrictive conditions which have been imposed on conventional devices.

The device according to the present invention comprises a first and a second chamber (i.e., a wafer treating chamber and a plasma generating chamber), gas supplying means, discharge means for producing a gas discharge in the plasma generating chamber to generate a gas plasma therein, and a coil which produces a minimum magnetic field. In this connection, it is to be noted that the minimum magnetic field or the minimum B-field is a coordination of magnetic field in which there exists a point which takes a minimum magnetic flux density that is different from zero. Thus, the plasma in the plasma generating chamber is confined stably therein. As a result, a stable and dense plasma is generated in the plasma generating chamber, and the speed of the wafer treatment is enchanced. Further, the conditions for plasma generation, such as gas pressure, are relaxed.

It is preferred that the device generate a plasma by a gas discharge caused by electron cyclotron resonance. Thus, preferably, the discharge means comprises means for supplying microwave energy to the plasma generating chamber whereby a gas plasma is generated by a gas discharge caused by electron cyclotron resonance driven by the microwave energy and the minimum magnetic field produced by the coil.

BRIEF DESCRIPTION OF THE DRAWINGS

Further features and details of the present invention will become clear from the following detailed description of a few preferred embodiments of the invention taken in conjunction with the accompanying drawings, in which.

In the drawings, like reference numerals represent like or corresponding parts or portions.

DETAILED DESCRIPTION OF THE PREFERRED EMBODIMENTS

Figure 1:
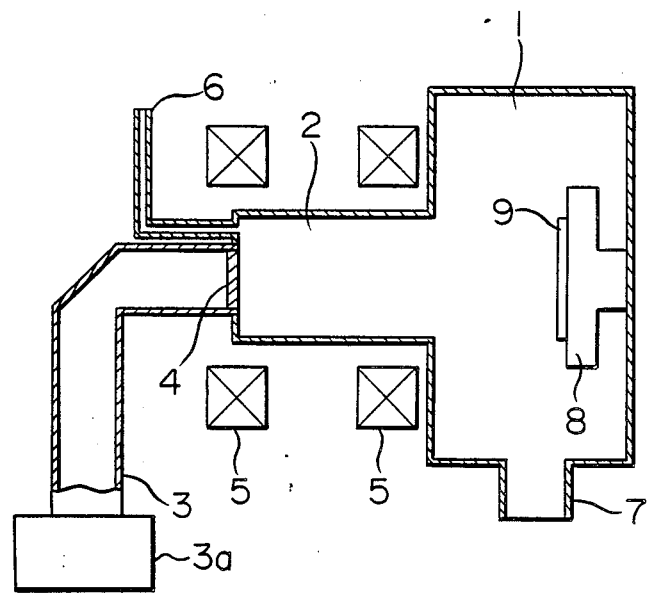
FIG. 1 is a sectional view of a wafer treating device according to the invention utilizing a plasma generated by a conventional gas discharge conventional.

Referring now to FIG. 1 of the drawings, an embodiment of the present invention is described.

Figure 3:
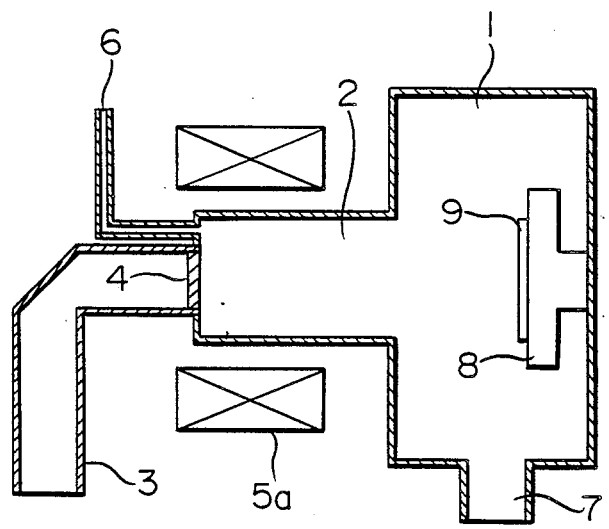
FIG. 3 is a view similar to that of FIG. 1, showing a conventional device.

A wafer treating device utilizing a plasma generated by electron cyclotron resonance shown in FIG. 1 has a structure similar to that of the device shown in FIG. 3 except for its electromagnetic coil. Specifically, the device of FIG. 1 comprises a cylindrical wafer treating chamber 1 accommodating a holder 8 for a wafer 9, and a cylindrical plasma generating chamber 2 disposed coaxially and adjacent to the wafer treating chamber 1. Microwave energy generated by a microwave source 3a, i.e. a magnetron, is introduced into the plasma generating chamber 2 through a waveguide 3 and a quartz plate 4.

Figures 2A, 2B:
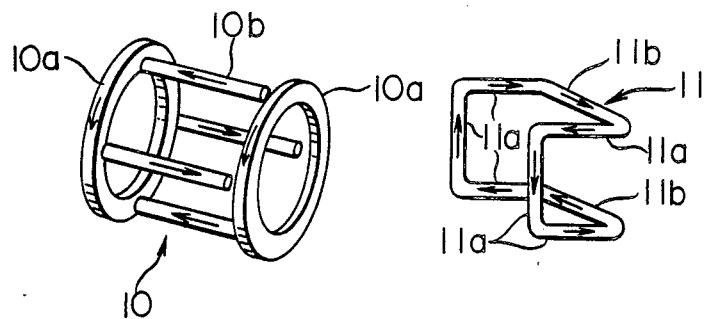
FIGS. 2a through 2c shows perspective views of minimum B-field producing coils which may be incorporated in the device of FIG. 1.
Figure 2C:
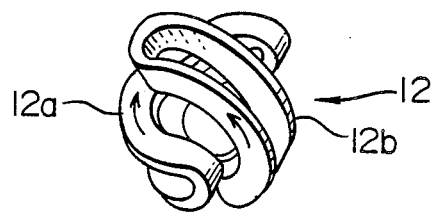

However, instead of the solenoidal electromagnetic coil 5a of FIG. 3, a minimum magnetic field i.e. minimum B-field) producing coil 5 is provided which surrounds the plasma generating chamber 2 to produce a magnetic field in the plasma generating chamber 2 and the wafer treating chamber 1. FIGS. 2a through 2c show three different examples of such coils which may be incorporated in the device of FIG. 1 as the minimum magnetic field producing coil 5.

Ioffe bars 10 shown in FIG. 2a may be employed as the minimum magnetic field producing coil 5 of FIG. 1. A pair of parallel and opposing current-carrying annular bars or rings 10a of an electrically conductive material, in which electric current flows in the directions shown by the arrows to form a mirror image field, are disposed coaxially around the cylindrical plasma generating chamber 2. Four straight parallel current carrying bars 10b running at right angles to the planes of the annuli 10a, in which electric current flows in the direction shown by the arrows to produce a cusp field, are disposed parallel to the axis of the cylindrical plasma generating chamber 2. Thus, the Ioffe bars 10 produce a minimum magnetic field (i.e., a coordination or distribution of a magnetic field which has a point that takes a minimum magnetic flux density which is different from zero) which is obtained by superposing the mirror field produced by the annuli 10a on the cusp field produced by the straight bars 10b.

Other coils which are known to produce a minimum magnetic field, such as a baseball coil 11 shown in FIG. 2b or a Yin-yang coil 12 shown in FIG. 2c, may also be employed as the coil 5 of FIG. 1. In the case where the baseball coil 11 is used as the minimum magnetic field producing coil 5, the coil 11 is disposed around the plasma generating chamber 2 in such a way that a pair of opposed parallel channel-shaped portions 11a thereof, in which current flows in the directions shown by the arrows to produce a cusp field, run parallel to the axis of the cylindrical plasma generating chamber 2. A pair of cross bars 11b connecting between the channel-shaped portions 11a and in which current flows in the directions shown by the arrows to produce a mirror image field, extend transversely of the cylindrical plasma generating chamber 2. In the case where the Yin-yang coil 12 is used as the minimum magnetic field producing coil 5 of FIG. 1, the coil 12 is disposed around the plasma generating chamber 2. A pair of semicircular rings 12a, 12b, each of which is formed of an annular ring member folded along a diametrical line into a double semi-circular configuration, cross each other to form a letter X as viewed from the side. The cylindrical plasma generating chamber 2 is interposed between and partially surrounded by the semi-circular rings 12a, 12b.

The device of FIG. 1 also comprises a gas introducing port 6 and a gas exhausting port 7, which are formed in the end plate of the plasma generating chamber 2 and the side wall of the wafer treating chamber 1, respectively.

A treatment of the wafer 9, e.g. etching, is effected as follows.

After the gas remaining in the chambers 1 and 2 is thoroughly exhausted from the port 7, a reactive gas, i.e. $Cl_2$ is introduced into the chambers 1 and 2 through the port 6; at the same time, a part of the gas is exhausted from the port 7 to keep the pressure in chamber thereof at a predetermined level. Next, microwave energy having the frequency of 2.45 GHz generated by the microwave source 3a is supplied to the plasma generating chamber 2 through the waveguide 3 and the quartz plate 4. At the same time, the coil 5 is energized to produce a magnetic field in the plasma generating chamber 2 and the wafer treating chamber 1. The magnetic field produced in the plasma generating chamber 2 is a minimum B-field which results from the superposition of a mirror image field on a cusp field. Thus, in the neighbourhood of the point which takes a minimum value of magnetic flux density, the magnetic flux density increases in every direction going away from the point. The flux density of the magnetic field in the neighborhood of the point at which the flux density takes its minimum value in the plasma generating chamber 2 is regulated to 875 G to produce electron cyclotron resonance therearound in cooperation with the microwave energy. Consequently, the plasma generated in the plasma generating chamber 2 is confined therein in a most stable manner. In particular, as the electrons in the plasma are confined effectively, the density of electrons and hence that of the plasma in general are increased. Further, as the confinement efficiency of the plasma in the plasma generation chamber 2 is improved, a stable plasma can be generated in a gas which is at a pressure level as low as $10^{-5}$ Torr.

The magnetic field produced by the coil 5 in the wafer treating chamber, on the other hand, diverges from the plasma generating chamber 2 to the holder 8. Thus, the plasma is transported to the wafer 9 along the diverging lines of the magnetic field produced by the coil 5, and the treatment of the wafer, i.e. etching, is effected.

The particulars of the device shown in FIG. 1 comprising the Ioffe bars 10 as the minimum magnetic field producing coil 5 are as follows:

| | |
|---|---|
| diameter of the plasma generating chamber 2 | 200 mm |
| axial dimension of the plasma generating chamber 2 | 180 mm |
| diameter of the annuli 10a of the Ioffe bars 10 | 330 mm |
| axial dimension of the Ioffe bars 10 | 350 mm |
| minimum flux density of the magnetic field in the plasma generating chamber 2 | 875 G |
| frequency of the microwave source | 2.45 GHz |
| output power of the microwave source | 1 KW |
| material of the gas | $Cl_2$ |
| gas pressure | $5 \times 10^{-5}$ Torr |

Although the foregoing description has been made only of the embodiment in which a plasma is generated by an electron cyclotron resonance discharge, the present invention is not limited thereto and is applicable to any wafer treating device utilizing a plasma generated by a gas discharge such as an HF (high frequency) discharge, a magnetron discharge and a PIG discharge.

What is claimed is:

1. A device for treating semiconductor wafers utilizing a plasma generated by a gas discharge comprising:
   a first chamber accommodating holder means for holding a semiconductor wafer;
   a second chamber disposed adjacent to and in communication with said first chamber;
   gas supplying means for supplying a gas to said second chamber;
   discharge means for producing a gas discharge in said second chamber, thereby generating a plasma of the gas in said second chamber; and
   magnetic field producing means for producing a magnetic field having a minimum, non-zero value at a location in said second chamber, the magnetic field increasing in said second chamber in every direction from the location of the minimum, non-zero value, comprising two annular coils surrounding said second chamber and Ioffe bars electrically interconnected with said coils.

2. A device for treating semiconductor wafers as claimed in claim 1 wherein said discharge means comprises means for supplying microwave energy to said second chamber, the plasma of said gas being generated by a gas discharge caused by said microwave energy supplied to said second chamber.

3. A device for treating semiconductor wafers as claimed in claim 1 wherein said gas discharge means comprises means for supplying microwave energy at a predetermined frequency to produce electron cyclotron resonance in the gas discharge.

4. A device for treating semiconductor wafers utilizing a plasma generated by a gas discharge comprising:
   a first chamber accommodating holder means for holding a semiconductor wafer;
   a second chamber disposed adjacent to and in communication with said first chamber;
   gas supplying means for supplying a gas to said second chamber;
   discharge means for producing a gas discharge in said second chamber, thereby generating a plasma of the gas in said second chamber; and
   magnetic field producing means for producing a magnetic field having a minimum, non-zero value at a location in said second chamber, the magnetic field increasing in said second chamber in every direction from the location of the minimum, non-zero value, comprising a baseball coil disposed around said second chamber.

5. A device for treating semiconductor wafers utilizing a plasma generated by a gas discharge comprising:
   a first chamber accommodating holder means for holding a semiconductor wafer;
   a second chamber disposed adjacent to and in communication with said first chamber;
   gas supplying means for supplying a gas to said second chamber;
   discharge means for producing a gas discharge in said second chamber, thereby generating a plasma of the gas in said second chamber; and
   magnetic field producing means for producing a magnetic field having a minimum, non-zero value at a location in said second chamber, the magnetic field increasing in said second chamber in every direction from the location of the minimum, non-zero value, comprising a Yin-yang coil surrounding said second chamber.

* * * * *